United States Patent
Elliott

(10) Patent No.: US 9,900,021 B1
(45) Date of Patent: Feb. 20, 2018

(54) METHOD AND APPARATUS FOR DIGITAL MODIFICATION AND/OR MODULATION OF OPTICAL SIGNALS

(71) Applicant: HRL Laboratories, LLC, Malibu, CA (US)

(72) Inventor: Kenneth R. Elliott, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/098,292

(22) Filed: Apr. 13, 2016

Related U.S. Application Data

(60) Provisional application No. 62/147,452, filed on Apr. 14, 2015.

(51) Int. Cl.
  *H03M 1/00* (2006.01)
  *H03M 1/66* (2006.01)
  *G02F 7/00* (2006.01)
  *G02F 1/01* (2006.01)

(52) U.S. Cl.
  CPC ............... *H03M 1/66* (2013.01); *G02F 1/011* (2013.01); *G02F 7/00* (2013.01)

(58) Field of Classification Search
  CPC .... H03M 1/66; H03M 1/00; H03M 2201/422; G02F 7/00; G02F 1/00
  USPC .................................................. 341/137, 155
  See application file for complete search history.

(56) References Cited

U.S. PATENT DOCUMENTS 8,744,219 B2 * 6/2014 Kato ..................... G02F 1/0327
  385/3

* cited by examiner

*Primary Examiner* — Khai M Nguyen
(74) *Attorney, Agent, or Firm* — Ladas & Parry

(57) ABSTRACT

An apparatus comprised of a cascaded series of optical modulators addressed by a multi-bit digital word with each optical modulator in the cascaded series being responsive to a single bit in the multi-bit digital word and wherein each of the optical modulators in the cascaded series of optical modulators doubling in effective optical length as a bit index of the bit of the multi-bit digital word to which it is responsive increases by a bit index value equal to one. The apparatus may be used with a prior art analog optical modulator and an associated ADC, having a fixed bit width, to extend the number of bits beyond the fixed bit width that the ADC and analog optical modulator prior art combination can otherwise operate.

25 Claims, 6 Drawing Sheets

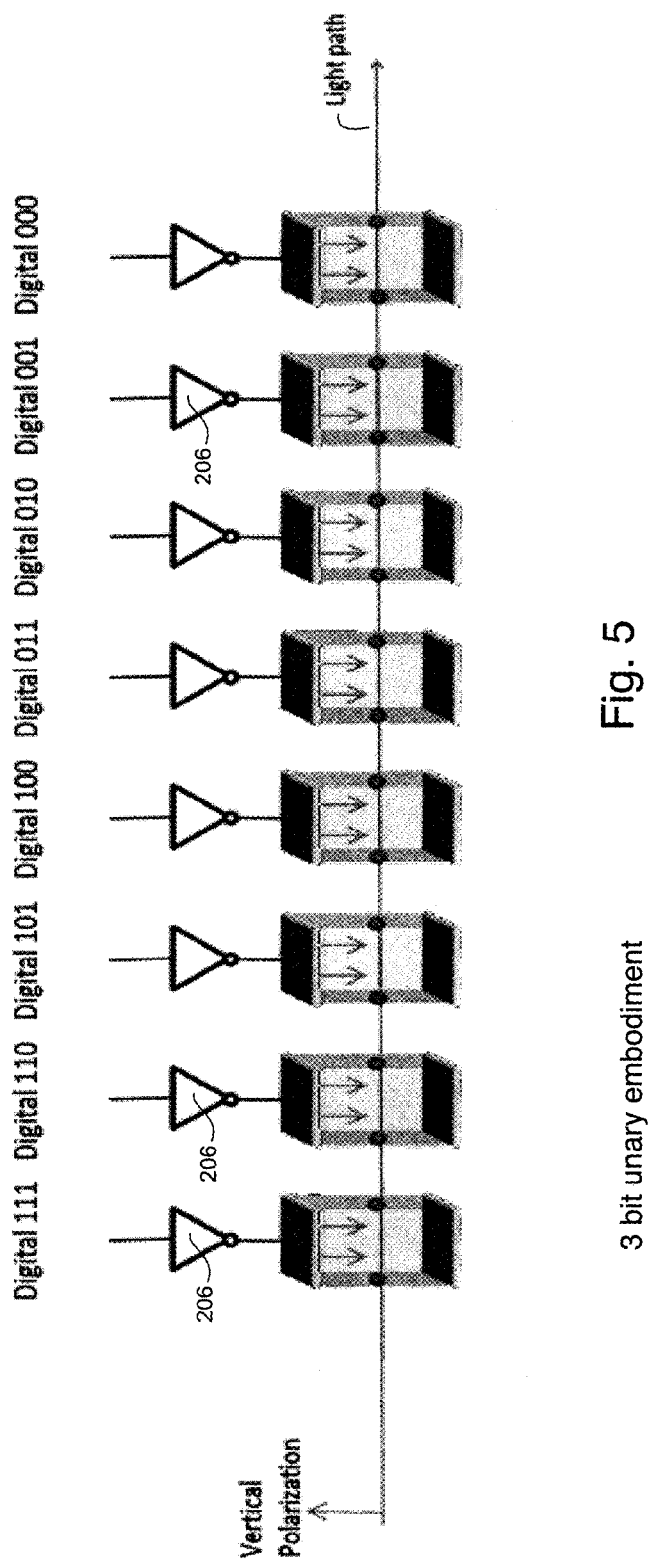

METHOD AND APPARATUS FOR DIGITAL MODIFICATION AND/OR MODULATION OF OPTICAL SIGNALS

CROSS REFERENCE TO RELATED APPLICATIONS

This application claims the benefit of U.S. Provisional Patent Application No. 62/147,452 filed Apr. 14, 2015 and entitled "Method for Digital to Optical Conversion", the disclosure of which is hereby incorporated herein by reference.

STATEMENT REGARDING FEDERALLY SPONSORED RESEARCH OR DEVELOPMENT

None.

TECHNICAL FIELD

This invention relates to a method and apparatus for obtaining extremely high resolution modification of optical beams with substantially reduced noise using a digital interface. The present invention also relates to modulation of an optical beam, and more particularly to high resolution linear optical modulation with substantially reduced noise using a multi-bit digital control signal.

BACKGROUND

There is a desire to be able to frequency synthesize high precision optical signals over many decades of bandwidth with a high frequency stability (~1 Hz) for LADAR, remote sensing, and optical spectroscopy, among other uses, including automotive and aerospace applications.

A very wide tuning range (1 Hz-10 GHz) is desirable, but the ability to obtain such a large range is currently limited by the dynamic range of the available electronic components. FIGS. 1a and 1b show conventional methods for providing digital optical path changes in prior art using transverse electro-optic phase modulators. FIG. 1a is a block diagram illustrating the apparatus used in a conventional method of providing analog controlled optical path changes a length and FIG. 1b is a block diagram illustrating the apparatus used in a conventional method of digital controlled optical path length changes. In FIG. 1a, an optical input signal is coupled to an input of an optical delay device 102 in such a modulator. An optical output of the optical delay device 102 produces a delayed optical output signal. A driver amplifier 104 is coupled to a control input terminal of the delay circuit 102, and is responsive to an analog control signal. In operation, the optical delay device 102 modifies the optical beam to be delayed relative to the input signal by an amount specified by the value of the analog control signal. In general the optical beam can propagate bidirectionally that is from I/O 101-1 to I/O 101-2 or from I/O 101-2 to I/O 010-1.

In FIG. 1b, an optical input signal is coupled to an input terminal of a similar delay device 102. An output terminal of the delay circuit 102 of FIG. 1b produces a delayed optical output signal. A digital-to-analog converter (DAC) 154 is coupled to a control input terminal of the delay circuit 102, and is responsive to a multi-bit digital control signal. In operation, the digital-to-analog converter 102 converts the multi-bit digital control signal to a corresponding analog control signal. The analog control signal is coupled to the control input terminal of the optical delay circuit device 102. The delay device 102 produces an output signal which is delayed relative to the input signal by an amount specified by the value of the digital control signal. In general the optical beam can propagate bidirectionally that is from I/O 102-1 to I/O 102-2 or from I/O 102-2 to I/O 102-1 in delay device 102.

In FIG. 1b, an optical input signal is coupled to an input terminal of a similar delay device 102. An output terminal of the delay circuit 102 of FIG. 1b produces a delayed optical output signal. A digital-to-analog converter (DAC) 154 is coupled to a control input terminal of the delay circuit 102, and is responsive to a multi-bit digital control signal. In operation, the digital-to-analog converter 102 converts the multi-bit digital control signal to a corresponding analog control signal. The analog control signal is coupled to the control input terminal of the optical delay circuit device 102. The delay device 102 produces an output signal which is delayed relative to the input signal by an amount specified by the value of the digital control signal. In general the optical beam can propagate bidirectionally that is from I/O 102-1 to I/O 102-2 or from I/O 102-2 to I/O 102-1 in delay device 102.

In FIGS. 1a and 1b, the resolution is limited by the electrical properties of the analog driver amplifier 104 and/or the DAC 154. Specifically, the maximum output voltage from the analog driver amplifier and/or DAC sets the most significant optical change and the point at which the noise level becomes significant sets the minimal output level. With existing DACs, the dynamic range is on the order of 12-20 bits depending on the output bandwidth.

On the other hand, at least 34 bits are required to define a frequency tuning range of 10 GHz with 1 Hz resolution. An optical device which can augment a presently achievable DAC resolution of 20 bits by an additional 10 to 20 bits with a comparable noise level is therefore desirable.

The current invention permits a designer to circumvent the dynamic range limitation of current DACs by augmenting it with weighted optical elements for the most significant bits each driven by a single binary electrical line of multi-bit bus. Each of the more significant bits may operate with the same digital driver voltage well above the electrical noise level of the driver. At that point when the resolution of the chain is limited by the optical element, the less significant bits may be driven by a multi-bit conventional DAC to provide fine resolution.

One advantage of this approach is realized when each binary element (individual modulator), has a high impedance and is driven by a fully complimentary CMOS driver with approximately zero static current. Since MOSFET 1/f noise is normally proportional to the current, the 1/f noise of approximately zero current CMOS drivers will be negligible. So CMOS drivers are preferable compared to either traditional (non-complementary) MOS or bipolar drivers.

BRIEF DESCRIPTION OF THE INVENTION

In one aspect the present invention provides an optical apparatus for delaying an optical signal provided by an source of optical energy in accordance with the multi-bit digital word, the multi-bit digital word having a plurality of bits of lesser bit significance and a having plurality of bits of greater bit significance, the plurality of bits having a greater bit significance being each being more significant than the plurality of bits of lesser bit significance, the device comprising: (i) an analog optical modulator and multi-bit DAC, the multi-bit DAC coupled to receive the bits of lesser bit significance of the multi-bit digital word and having an output coupled to an input of the analog optical modulator, the analog optical modulator imposing a delay on said optical signal corresponding or relating to a value of the bits of lesser bit significance of the multi-bit digital word; (ii) a plurality of digitally controlled optical modulators, said plurality of digitally controlled optical modulators each having a different effective optical length and each imposing a delay on said optical signal corresponding or relating to a value of a bit at a different bit index of the bits of greater bit significance of the multi-bit digital word, and wherein the analog optical modulator and the plurality of optical modulators being coupled in series with the source of optical energy to impose a total delay corresponding to or relating to the value of the multi-bit. digital word on the optical signal provided by the source of optical energy and output by the optical apparatus In another aspect the present invention provides an apparatus comprised of a cascaded series of optical modulators addressed by a multi-bit digital word with each optical modulator in the cascaded series being responsive to a single bit in the multi-bit digital word and wherein each of the optical modulators in the cascaded series of optical modulators doubling in effective optical length as a bit index of the bit of the multi-bit digital word to which it is responsive increases by a bit index value equal to one.

In yet another aspect the invention provides an optical apparatus for amplitude modulating an optical signal provided by an source of optical energy in accordance with the multi-bit digital word, the multi-bit digital word having a plurality of bits of lesser bit significance and a having plurality of bits of greater bit significance, the plurality of bits having a greater bit significance being each being more significant than the plurality of bits of lesser bit significance, the device comprising: (i) an analog optical modulator and multi-bit DAC, the multi-bit DAC coupled to receive the bits of lesser bit significance of the multi-bit digital word and having an output coupled to an input of the analog optical modulator, the analog optical modulator amplitude modulating the optical signal corresponding or relating to a value of the bits of lesser bit significance of the multi-bit digital word; and (ii) a plurality of digitally controlled optical modulators, the plurality of digitally controlled optical modulators each having a different effective optical length and each amplitude modulating the optical signal corresponding or relating to a value of a bit at a different bit index of the bits of greater bit significance of the multi-bit digital word; and wherein the analog optical modulator and the plurality of optical modulators being coupled in series with the source of optical energy to provide an amount of amplitude modulation corresponding to or relating to the value of the multi-bit digital word on the optical signal provided by the source of optical energy and output by the optical apparatus.

In still yet another aspect the invention provides a method of modulating an optical signal, the method including arranging a plurality of optical modulators in a cascaded series thereof, addressing each of the optical modulators in the cascaded series with a single bit of a multi-bit digital word according to a state of a CMOS driver having, in use, a negligible static current flow and increasing the effective optical length each of the optical modulators in the cascaded series of optical modulators by doubling its effective optical length as a bit index of the bit of the multi-bit digital word by which it is addressed increases by a bit index value equal to one.

In still yet another aspect the present invention provides a system comprising a CMOS direct driver of high impedance optical elements of an optical modulator formed by a cascaded arrangement of the optical elements, the CMOS direct driver providing, in use, approximately a zero static current flow.

In yet another aspect the present invention provides a method of reducing noise of a modulator comprising a cascaded series of individual modulators of varying effective optical lengths, the method comprising driving each of the individual modulators by a CMOS driver according to a different bit of a multi-bit digital word, the CMOS driver providing, in use, approximately a zero static current flow to said individual modulators.

In still another aspect the present invention provides a method of reducing noise of a modulator, the method comprising: driving the modulator by a CMOS driver and operating the CMOS driver without a terminating resistor whereby the CMOS driver provides, in use, approximately a zero static current flow to said modulator.

BRIEF DESCRIPTION OF THE DRAWINGS

FIG. 5 is a block diagram of another embodiment of a transverse electro-optic phase modulator, this embodiment providing a 3-bit unary-weighted digital to optical path length converter.

DETAILED DESCRIPTION

An important feature of the present invention is the direct drive of preferably high impedance weighted optical modulating elements 208 for preferably at least the most significant bits (MSBs) of an optical time delay apparatus or modulator 200 formed by the cascaded sum of these elements 208. Each element 208 is preferably provided by transverse electro-optic modulator. A block diagram is shown by FIG. 2 which illustrates one possible embodiment corresponding to both a method of and an apparatus for providing high resolution optical path changes (which provide time delays of the applied optical signal) according to principles of the present invention.

Figure 2:
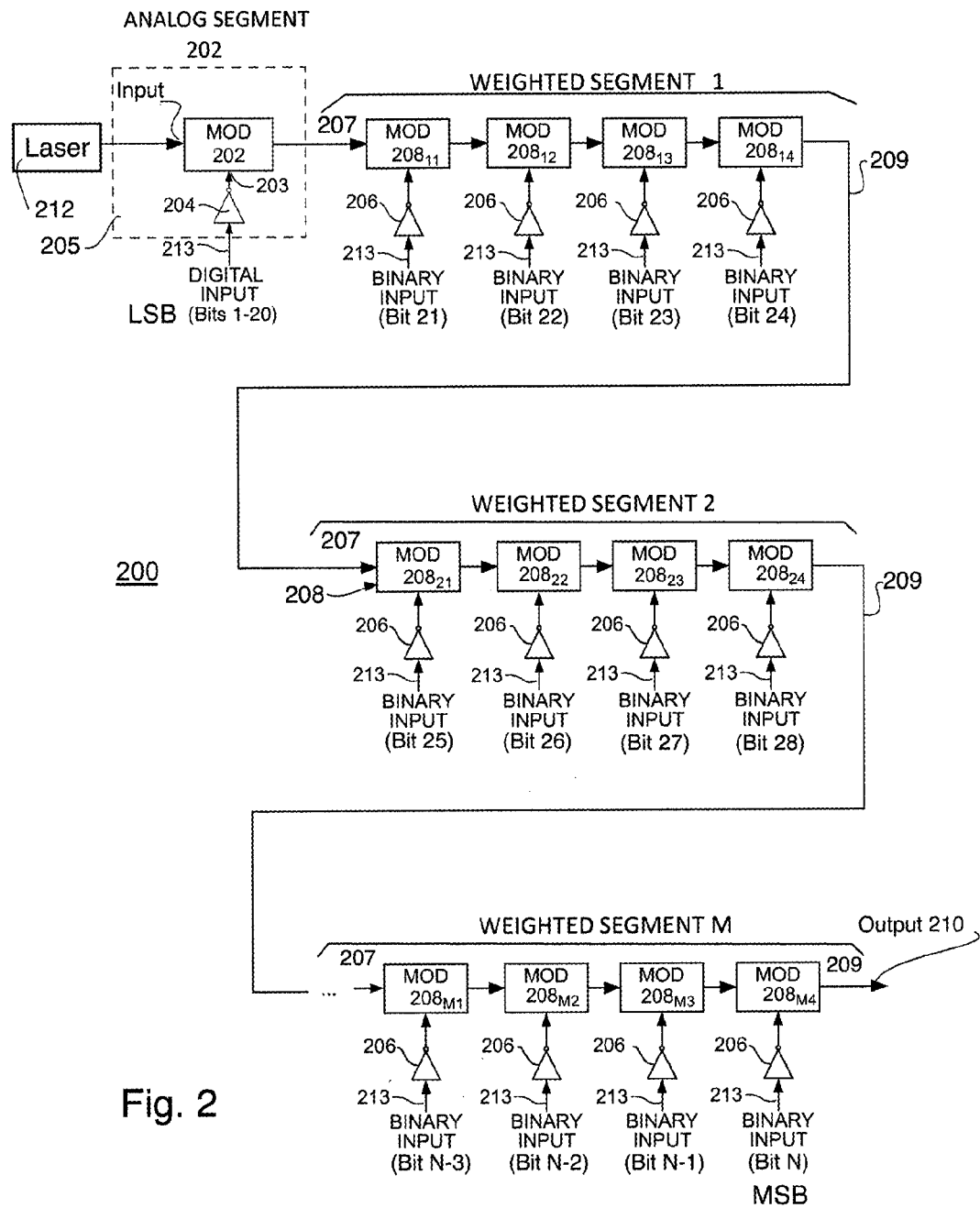
FIG. 2 is a block diagram illustrating one embodiment corresponding to both a method of and an apparatus for providing high resolution optical path changes according to principles of the present invention.

The weighted optical modulating elements 208 may organized in an array and in FIG. 2 four weighted optical modulating elements 208 are placed in a segment and M segments are depicted. The number of weighted optical modulating elements 208 per segment and the number of segments may be varied as is convenient to both an understanding of the present invention and its implementation as a desired embodiment. Each modulating element is uniquely identified on FIG. 2 by the use of subscripts. The first subscripted number or letter refers to the segment in which the modulator occurs while the second subscripted number refers to the bit position or thermometer code position (which are also referred to as stages herein) within a given segment. So modulator $208_{N4}$ refers the right hand most modulator of segment M in FIG. 2.

Figure 3:
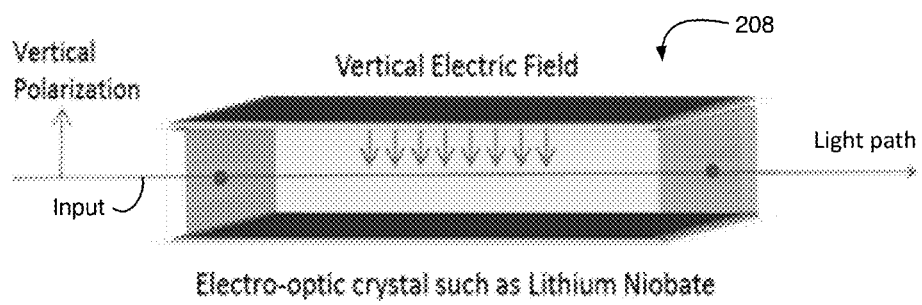
FIG. 3 is a schematic diagram of a simple transverse electro-optic phase modulator.
Figure 6:
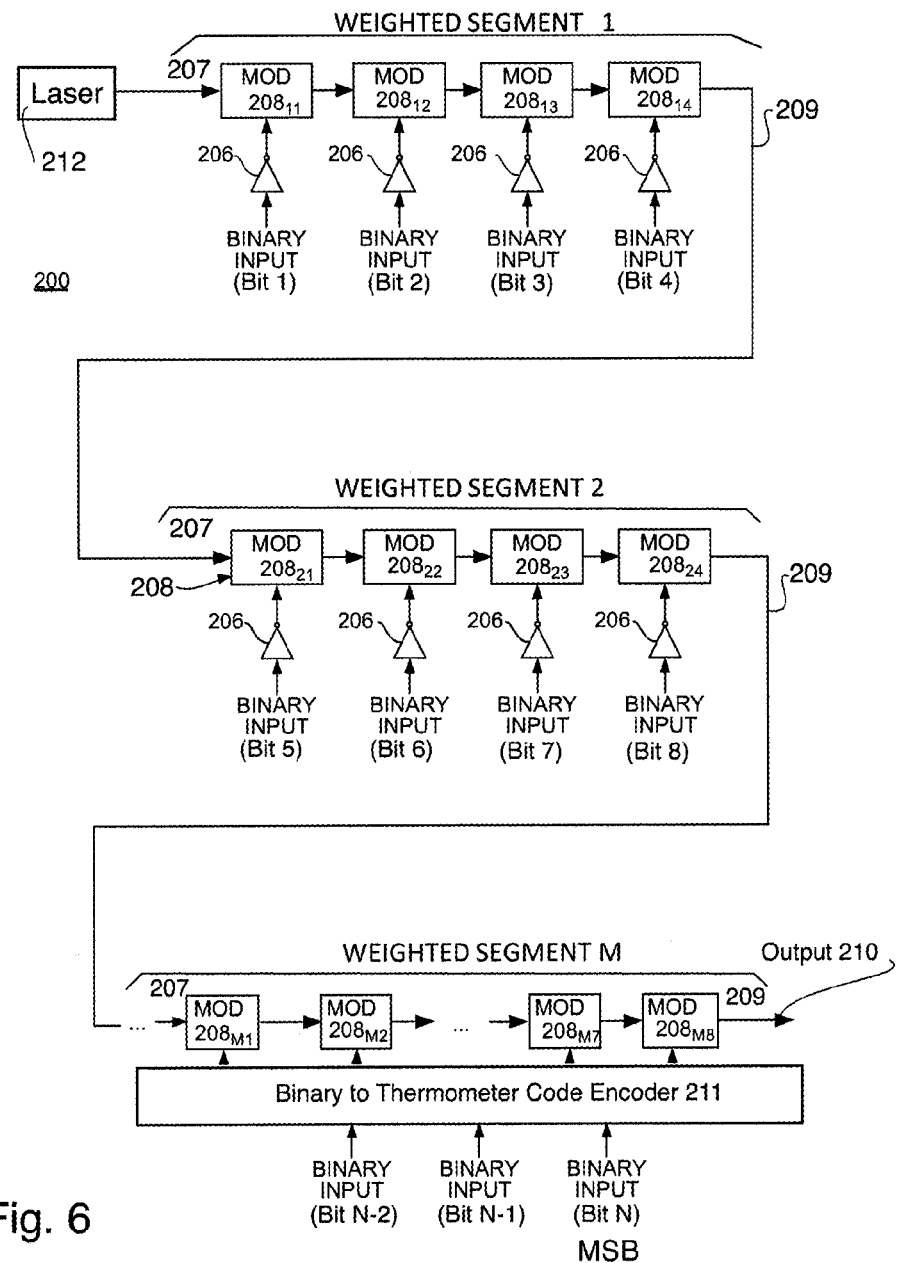
FIG. 6 is a block diagram of another embodiment of the present invention, this embodiment providing an optical path length converter that utilizes both binary and a unary weighted segments.

FIG. 3 shows one possible embodiment of a transverse electro-optic phase modulator 208. In FIG. 3, the input would be a linearly polarized laser beam and this single bit optical modulator 208 is a transverse electro-optic phase modulator when fabricated from an electro-optic material such as Lithium Niobate, indium phosphide or any other material with a suitable electro-optic coefficient. See also FIGS. 4 and 5 where the pluralities of the single bit transverse electro-optic phase modulators 208 of FIG. 3 are preferably arranged in either a binary or a 3-bit unary segment of modulators 208, which pluralities are then utilized as depicted in FIGS. 2 and 6.

Figure 4:
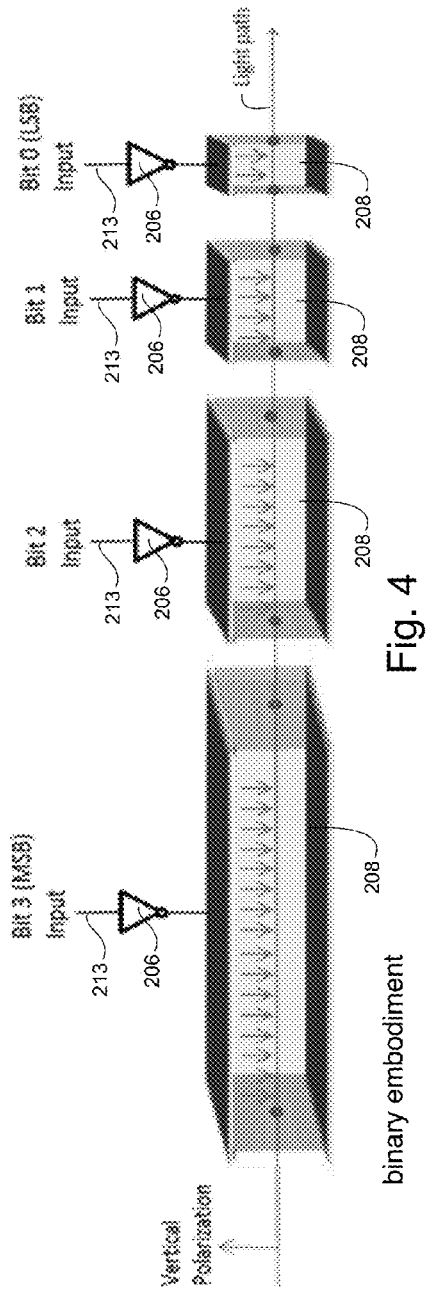
FIG. 4 is a block diagram of another embodiment of a transverse electro-optic phase modulator, this embodiment providing a 4-bit binary-weighted digital to optical path length converter.

The elements 208 either have different physical lengths (and hence different optical path lengths . . . see the binary modulator embodiment FIG. 4) or effectively change their effective optical path lengths by changing their index of refraction (see the unary modulator embodiment FIG. 5). While the elements 208 are preferably formed as transverse electro-optic phase modulators, as will be discussed later, elements 208 may also (or alternatively) be formed as electro-absorption modulators.

In FIG. 4 four elements 208 are depicted with the optically shorter element 208 corresponding to the LSB of the four bits of data on bus 213 in FIG. 4 and the longer element 208 corresponding to the MSB of the four bits of data on bus 213 in FIG. 4. The lengths of these elements 208 double as the significance of the bit increases by one, so the MSB element 208 is eight times the length of the LSB element of FIG. 4.

Turning again to FIG. 2, consider Weighted Segment 1 therein. The MSB of Weighted Segment 1 is bit significance index 24 (in this embodiment) which appears on the left hand side of Weighted Segment 1, while the LSB of Weighted Segment 1 is bit significance index 21 (in this embodiment) which appears on the right hand side of Weighted Segment 1. The binary modulator of FIG. 4 may be utilized as Weighted Segment 1 of FIG. 2 since each has the same number of modulators 208. The MSB to LSB order is reversed in FIG. 4, but that order does not matter (since the imposed light delays are cumulative), but the bit significance index needs to correspond correctly with the lengths of the individual binary modulators elements 208.

This bit significance index correspondence with the lengths of the individual binary modulator elements 208 remains true for the modulators in Weighted Segment 2 of FIG. 2 (and indeed true for all of the modulators of FIG. 2). So modulator $208_{21}$ which corresponds to bit 25 (in this embodiment) of the data on bus 213 must be optically twice as long as modulator $208_{14}$ which corresponds to bit 24 (in this embodiment) of the data on bus 213 and it will be recalled that that modulator is eight times as long as the LSB of modulator $208_{11}$ in Weighted Segment 1. So the optical lengths of the individual modulator elements 208 in FIG. 2 doubles each time the bit significance index increases one.

That can result in a very long device. And for that reason the least significant bits of the data on bus 213 are preferably processed using a prior art device 205 while the more significant bits of the data on bus 213 are preferably processed with the modulators in Segments 1-M. In FIG. 2 is it assumed that the prior art device 205 is a twenty bit modulator, so the optically shortest modulator $208_{11}$ corresponds to bit significance index of 21. If prior art device 205 were only a sixteen bit modulator, then the optically shortest modulator $208_{11}$ would correspond instead to a bit significance index of 17.

The apparatus 200 of FIG. 2 generates an optical output signal at output 210. The optical delay, Y, at output 210 is a function of the sum of the delays from the individual modulating optical elements 208, i.e. $Y=\Sigma w_i A_i$ where $A_i$ is the bit value and the weight $w_i=nl_i/c$ corresponds to the delay due to the optical path length change, where n is the electric field induced change in optical index, $l_i$ is the physical length of the $i^{th}$ individual modulator 208 and c is the speed of light.

In the embodiment of FIG. 2, the optical delay, Y, at output 210 is also a function of the delay occurring in element 205. Element 205 (whose use is optional) may be a prior art device (if desired) modulator capable of handling, for example, bits 1-20 (the least significant bits) of the digital word applied on bus 213 to the apparatus 200 of FIG. 2. It will be recalled that present invention permits a designer to circumvent the dynamic range limitation of current (prior art) DAC-driven modulators by augmenting it with weighted optical elements for the more significant bits on bus 213. So in the embodiment of FIG. 2, element 205 corresponds to such a prior art DAC-driven modulators while Segments 1-M do the augmenting in such this embodiment.

The result is a digitally controlled optical delay circuit 200 which provides a delay corresponding to $Y=\Sigma w_i X_i$ where Y is the output delay, $w_i$ is the weighted delay and $X_i$ is the digital input value. One embodiment is for the binary sequence where $w_i=\tau_0 \times 2^n$, n=1, 2, 3, etc. up to the value N representing N bits of the digital word on bus 213 where $\tau_0=nl_0/c$ represents a unit delay change for a unit length of $l_0$. A somewhat different embodiment would occur for a unary sequence where each value of $w_i$ is equal to $\tau_0$ and the digital input is encoded with a thermometer code for $2^N$ elements for N bits.

See the hybrid embodiment of FIG. 6 where the most significant bits are converted to a thermometer code before being applied to a unary modulator (such as that shown by FIG. 5) in one segment (Segment M) while the less significant bits are applied to a number of individual binary modulators (such as that shown by FIG. 4). Of course, a unary modulator could be used for all M weighted segments of FIG. 6. The encoding of thermometer codes is well known so that does not need to be described here, but the encoding is done in an encoder 211 (which preferably also has complementary CMOS drivers built into it).

It should be noted that in the embodiment of FIG. 6 the prior art modulator 205 is not shown since it need not necessarily be used, at least from a theoretical view point. But from a practical viewpoint, it is preferably used, even in the embodiment of FIG. 6. The reason for this is straightforward the physical lengths of the individual modulators 208 can become very long in order for their effective optical lengths to keep doubling as the bit significance increases. So a prior art modulator 205 capable of twenty bits is preferably utilized to help keep this optical length doubling of the individual modulators 208 in check.

Hybrid weighting with a segments of both unary (see FIG. 5) and binary (see FIG. 4) weighted segments results in a somewhat more complex embodiment of FIG. 6 where Segments 1, 2 . . . are Binary while the final Segment M is unary). For a transverse electro-optic phase modulator, the weights could be proportional to the length of individual elements. For the binary weight case the length would increase or decrease by a factor of two for each increase or decrease in the bit significance index. For the unary embodiment (see FIG. 5), each modulator 208 would preferably have the same length. Also, for a unary embodiment, a digital to thermometer code encoder 211 would be utilized to convert, for example, the three most significant bits of the digital word being utilized to modify the optical signal into a thermometer code which is then applied to modulators $208_{N1}$-$208_{N8}$ of the embodiment of FIG. 6. If an unary embodiment is compared with a binary embodiment, the unary embodiment ends up having a greater overall length.

In a hybrid embodiment, such as that depicted by FIG. 6, a unary segment is preferably utilized with the MSB of the digital word applied to the apparatus of FIG. 6 to guarantee monotonicity of the delay for these segments as the digital value is scanned. Multiple unary portions may be used with different weighting to improve monotonic behavior other segments, but monotonic behavior is most important in the MSBs since any error in these values has the largest impact on the linearity of path length versus digital value.

The digital word applied to modulators 208 of FIGS. 2 and 6 can represent any sort of data which may be used to frequency modulate (for example) the optical signal produced by laser 212.

FIG. 2 presents a relatively simple embodiment (it is not a hybrid as discussed in the preceding paragraph). The input may be provided by optical energy such as a linearly polarized laser beam from a optical source such as laser 212 and the optical modulators 208 are preferably transverse electro-optic phase modulators fabricated from a material such as Lithium Niobate, indium phosphide or any other material with a suitable electro-optic coefficient. A prior art modulator 205 may be used in a relatively simple embodiment so that only the augmenting modulators 208 need be added to the prior art modulator 205 to achieve a greater bit resolution than that achievable using the prior art modulator 205 alone.

Describing FIG. 2 in greater detail, it is block diagram illustrating a relatively simple embodiment of a system 200 for providing high resolution optical path changes in response to a multi-bit digital code or word according to principles of the present invention. In FIG. 2, an optical input signal is coupled to a series or cascade arrangement of an optional analog weighting segment 202 and a plurality of weighted segments 1 to M, each of which comprises a plurality of one-bit transverse electro-optic elements 208 and each of which produce a delayed optical output signal 209 which is applied to an input of a following segment until the end of a chain of segments is reached where the output 210 of the modulator is presented. The optional analog weighting segment 202 may occur anywhere wherein the series or cascade arrangement, so it could be located nearer or at the output 210 end of the series or cascade arrangement if desired.

A laser is a preferred optical signal source 212 for the input to the transverse electro-optic delay elements 208 although any optical signal source compatible with the optical components would likely suffice. In the embodiment of FIG. 2, the optical input signal is coupled to an input terminal of the optional transverse electro-optic element 205 in Segment 202.

An output terminal of the transverse electro-optic element 202 produces a delayed optical signal. An output terminal of the digital-to-analog converter 204 is coupled to a control input terminal 203 of the modulator 202. In operation, this first stage (transverse electro-optic element 202 and digital-to-analog converter (DAC) 204 performs an analog time shift of the input optical signal from source 212, in response to the analog control signal applied at terminal 203. In the system 200, the bits supplied to the DAC 204 may be the least significant bits of a wider multi-bit digital control signal on bus 213. More specifically, the least significant bits (bit indices 1-20 in the embodiment of FIG. 2) of the digital control signal on bus 213 may be supplied to the DAC 204. The remaining more significant bits are supplied to the weighted segments 1-M.

The output terminal of the modulator 202 is coupled to an input of a series-connected arrangement of a plurality of N-B weighted segments, B to N where B is the bit index of the least significant bit processed by the Weighted Segments (bit index 21 in the embodiment of FIG. 2). Each weighted segment 1 to M comprises a plurality of stages. It should be understood that more or fewer stages may be included in each segment, and that different segments in a composite transverse electro-optic phase modulator or composite time delay element 200 may have different numbers of stages. In the illustrated embodiment of FIG. 2, each segment comprises four stages with each stage comprising a transverse electro-optic element 208 and a digital driver 206.

The weighted segments 1 to M are constructed preferably in the generally the same manner, although they may have differing numbers of stages. The Weighted Segment 1 will be described in detail here. Referring specifically to weighted segment 1, the input terminal 207 of the weighted segment is coupled to a series-connected arrangement of a plurality of modulators 208, e.g. four in the illustrated embodiment. So each modulator 208 may be considered to be a stage of a weighted segment. An output terminal 209 of the series connection of the plurality of modulators 208 produces a modulated output optical signal at the output terminal 209 of the weighted segment. Each stage also comprises a driver 206 responsive to respective binary, i.e. bistate, input signal having a first state represented by a binary digit (bit) "0" and a second state represented by a bit "1". An output terminal of the driver 206 is coupled to a control input terminal of the modulator 208.

In operation, each of the modulators 208 delay their respective optical input signal to one value in response to the input signal having a first state represented by a bit "0" and to a second different value of delay in response to the input signal having a second state represented by a bit "1". For example, these values of delay can well be discrete values such as a delay of 100 psec of a bit "0" and 120 psec for a bit "1" to provide a difference in delay of 20 psec depending on the state of the bit. As the lengths of modulators 208 double, the difference in delay doubles as well. The actual values will depend upon the specifics of the design of modulator 208, in particular its materials and length.

The binary control input signals supplied to the respective stages in the weighted segment represent the more significant bits (MSBs) of the multi-bit digital control signal, and in one embodiment represent the coefficients in a polynomial in which the terms n represent a weight of $2^n$, as described in detail above. The value of the polynomial represents the desired signal delay at output 210.

Figures 1A, 1B:
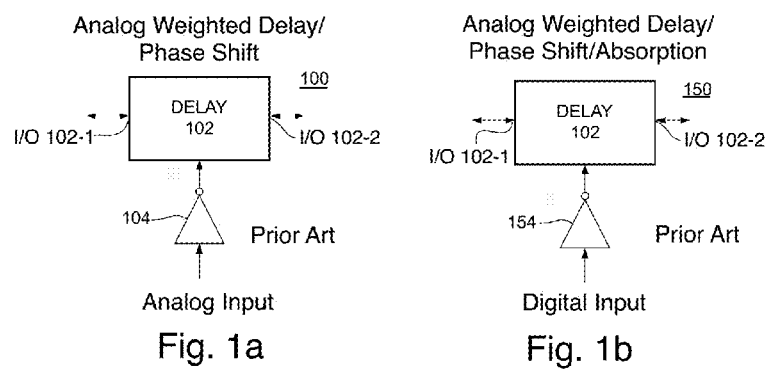
FIGS. 1a and 1b depict prior art circuits for providing digital optical path changes in prior art modulators.

As described above with respect to FIG. 1a and FIG. 1b, the resolution of a typical optical modulator is limited to 12 to 20 bits by the electrical properties of the DAC or analog amplifier due to the maximum output voltage for the most significant optical change and/or the noise level for the minimal output level. A system according to principles of the present invention permits a designer to overcome this limitation by weighting of the optical elements. Each of the control signals representing the more significant bits may operate with the same digital input voltage, well above the noise level.

At the point when the resolution is limited by the optical element, the lesser significant bits may be driven by a conventional DAC 205 to provide fine resolution. When the transverse electro-optic element 208 is driven by a CMOS driver (see FIG. 4a) and the 0 and 1 states represent a negligible (and preferably approximately zero) static current operating point, the output 1/f noise of the drivers will be low since the 1/f is typically proportional to the current for these drivers. As a result, the jitter or drift exhibited by the transverse electro-optic element will be much lower.

The fabrication and construction of modulators such as the individual modulator 208 is well known. In the case of a transverse electro-optic modulator 208, the output would have a time delay $\delta\tau_{out} = -(\Sigma n l_i))/c$ where n is the electric field induced change in optical index, $l_i$ is the physical length of the $i^{th}$ modulator segment and c is the speed of light. In these cases the length would represent the weight of the segment such that in a binary weighted system the length would double for each successive segment. FIG. 4 and FIG. 5 illustrate a binary weighted and unary weighted embodiments.

Figure 4A:
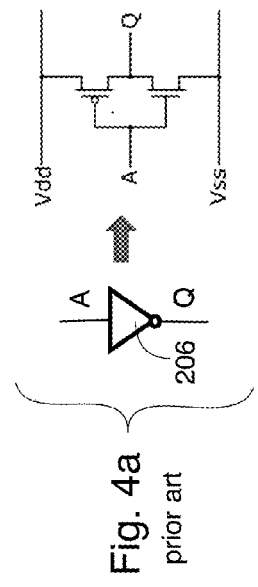
FIG. 4a is a schematic diagram of a complementary CMOS driver known per se in the prior art.

In FIG. 4 and FIG. 5, the driver 206 should preferably be a standard complimentary CMOS configuration or similar as shown in FIG. 4a. Such configurations are well known and are commonly used in different types of logic such as AND, NAND, XOR, NOR and other digital logic gates as well as in latches, flip flops and more complex CMOS-based circuits. A key understanding is that such logic generates very low levels of current noise when not switching since the current is typically negligible.

The darker surfaces shown in FIG. 4 and FIG. 5 represent plates which generate an electric field. The source of the vertically polarized light could be a laser or a light source with polarizer.

Figure 7:
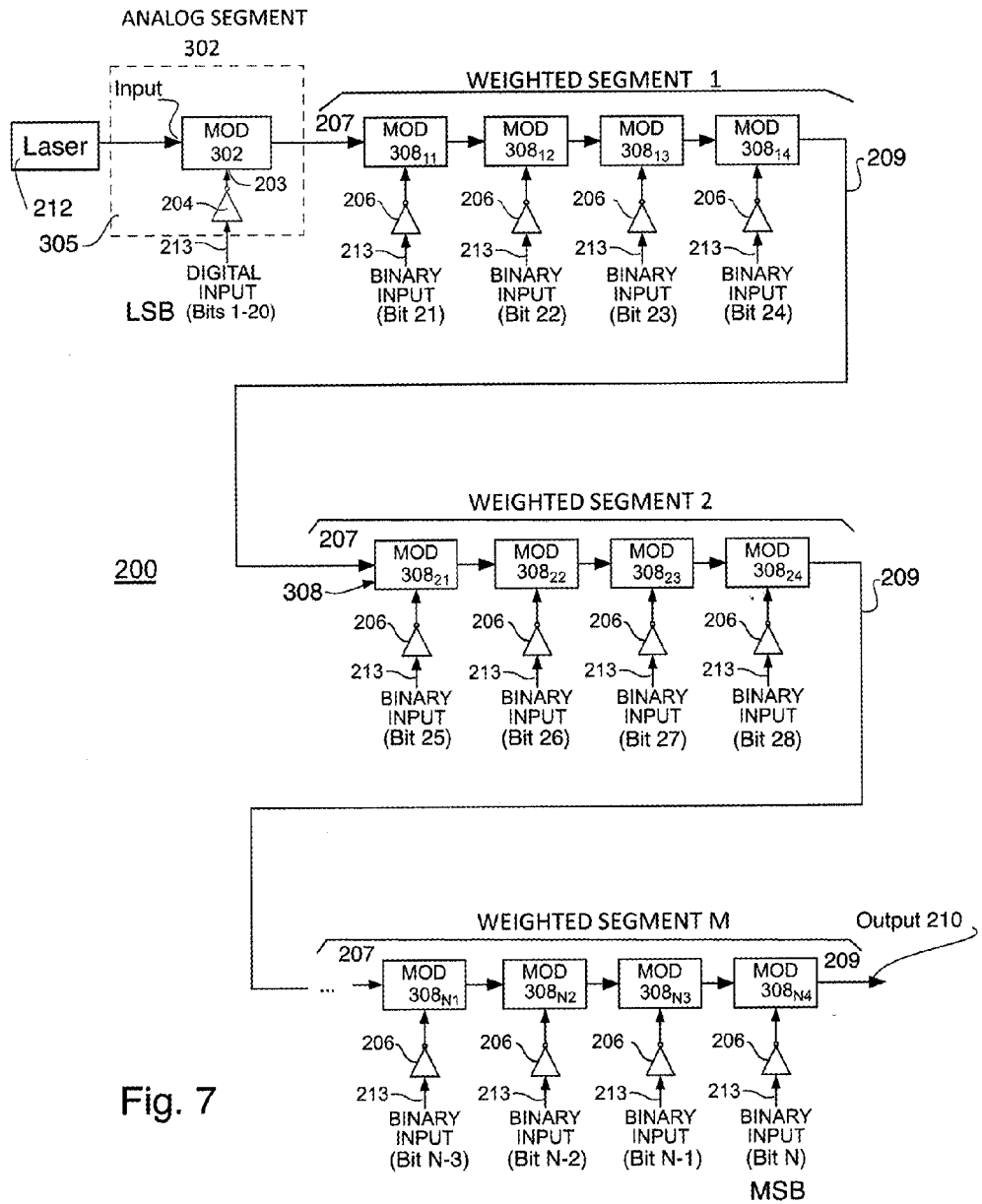
FIG. 7 is a block diagram of another embodiment, this embodiment substitutes electro-absorption modulators in place of transverse electro-optic modulators.

In an alternative embodiment optical intensity could be modified using electro-absorption or optical gain. The design and construction of electro-absorption modulators is well known. In this embodiment, modulating element 308 is an electro-absorption modulator driven by a digital voltage, and is assigned a weight In the case of an electro-absorption modulator, the output amplitude would be $A_{out} = A_o \exp(-\alpha (\Sigma l_i))$ where $A_o$ is the incident amplitude, $\alpha$ is the electric field induced change in absorption coefficient and $l_i$ is the length of an individual modulator. In this case, the factor $(\Sigma l_i)$ represents the aggregate digital path length change. The output amplitude varies exponentially with the digital input value for this embodiment. FIG. 7 illustrates this embodiment. Modulator 305 would preferably comprise a prior art optical signal amplitude modulator preferably modulating the optical signal in accordance with bits 1-20 of the multi-bit digital word 213 in this embodiment.

A stream of digital words on bus 213 of the apparatus of FIGS. 2 and 6 can effectively frequency modulate the optical signal from laser 212 so apparatus 200 may function as an FM optical modulator. The stream of digital words on bus 213 may correspond to video, audio, remote sensing, error correction data or any other digital data which mat be desirously used to modulate an optical signal. A stream of digital words on bus 213 of the apparatus of FIG. 7 can amplitude modulate the optical signal from laser 212.

The foregoing Detailed Description of exemplary and possibly preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims.

No Claim element herein is to be construed under the provisions of 35 U.S.C. §112(f), unless the element is expressly recited using the phrase "means for . . . " and no method or process step herein is to be construed under those provisions unless the step, or steps, are expressly recited using the phrase "comprising the step(s) of . . . ".

What is claimed is:

1. An optical apparatus for delaying or modulating an optical signal provided by a source of optical energy in accordance with a multi-bit digital word, the multi-bit digital word having a plurality of bits of lesser bit significance and a having plurality of bits of greater bit significance, the plurality of bits having a greater bit significance being each being more significant than the plurality of bits of lesser bit significance, the device comprising:
  i. an analog optical modulator and multi-bit DAC, the multi-bit DAC coupled to receive the bits of lesser bit significance of the multi-bit digital word and having an output coupled to an input of the analog optical modulator, the analog optical modulator imposing a delay on the optical signal corresponding or relating to a value of the bits of lesser bit significance of the multi-bit digital word; and
  ii. a plurality of digitally controlled optical modulators, the plurality of digitally controlled optical modulators each having a different effective optical length and each imposing a delay on the optical signal corresponding or relating to a value of a bit at a different bit index of the bits of greater bit significance of the multi-bit digital word;
  wherein the analog optical modulator and the plurality of optical modulators being coupled in series with the source of optical energy to impose a total delay corresponding to or relating to the value of the multi-bit digital word on the optical signal provided by the source of optical energy and output by the optical apparatus.

2. The optical apparatus of claim 1 wherein the plurality of digitally controlled optical modulators comprise a plurality of binary optical modulators and at least one unary optical modulator.

3. The optical apparatus of claim 2 wherein the plurality of binary optical modulators are each coupled with a different bit of the multi-bit digital word and wherein each optical modulator has different physical length.

4. The optical apparatus of claim 3 wherein the physical length of each binary optical modulator doubles in length as the bit index of bit of the multi-bit digital word with which it is coupled increases by a value of one.

5. The optical apparatus of claim 4 wherein the at least one unary optical modulator comprises a series of optical modulators each of which has the same optical length and each of which controlled by thermometer code derived from the selected bits of the bits of greater bit significance of the multi-bit digital word.

6. The optical apparatus of claim 5 wherein the thermometer code is derived from a plurality of the more significant bits of the multi-bit digital word including the most bit of the multi-bit digital word.

7. An apparatus comprising a cascaded series of optical modulators addressed by a multi-bit digital word with each optical modulator in the cascaded series being responsive to a single bit in the multi-bit digital word, wherein each of the optical modulators in the cascaded series of optical modulators doubling in effective optical length as a bit index of the bit of the multi-bit digital word to which it is responsive increases by a bit index value equal to one, and wherein each optical modulator in the cascaded series is responsive to a single bit in the multi-bit digital word according to the state of a CMOS driver having, in use, a negligible static current flow, the CMOS driver coupling each optical modulator in the cascaded series with the single bit in the multi-bit digital word to which is it responsive.

8. The apparatus of claim 7 wherein at least some of the optical modulators in the cascaded series are responsive to a plurality of bits in the multi-bit digital word encoded as a thermometer code and applied to the at least some of the optical modulators in the cascaded series.

9. The apparatus of claim 7 wherein the cascaded series of optical modulators is arranged as a plurality of weighted segments and wherein each weighted segment has a plurality of stages.

10. The apparatus of claim 9 wherein one of the weighted segments (weighted segment M) is coupled with the MSB of the multi-bit digital word, the one of the weighted segments (weighted segment M) having an overall effective optical length controlled by a binary to thermometer code encoder coupled to a plurality of the more significant bits of the multi-bit digital word including the MSB of the multi-bit digital word.

11. The apparatus of claim 7 wherein each optical modulator in the cascaded series includes an electro-optic material and therein the electro-optic material is selected to that said apparatus functions, in use, as (i) a FM modulator or (ii) an AM modulator.

12. An optical apparatus for amplitude modulating an optical signal provided by an source of optical energy in accordance with the multi-bit digital word, the multi-bit digital word having a plurality of bits of lesser bit significance and a having plurality of bits of greater bit significance, the plurality of bits having a greater bit significance being each being more significant than the plurality of bits of lesser bit significance, the device comprising:

i. an analog optical modulator and multi-bit DAC, the multi-bit DAC coupled to receive the bits of lesser bit significance of the multi-bit digital word and having an output coupled to an input of the analog optical modulator, the analog optical modulator amplitude modulating the optical signal corresponding or relating to a value of the bits of lesser bit significance of the multi-bit digital word; and ii. a plurality of digitally controlled optical modulators, the plurality of digitally controlled optical modulators each having a different effective optical length and each amplitude modulating the optical signal corresponding or relating to a value of a bit at a different bit index of the bits of greater bit significance of the multi-bit digital word;

wherein the analog optical modulator and the plurality of optical modulators being coupled in series with the source of optical energy to provide an amount of amplitude modulation corresponding to or relating to the value of the multi-bit digital word on the optical signal provided by the source of optical energy and output by the optical apparatus.

13. The optical apparatus of claim 12 wherein the plurality of digitally controlled optical modulators comprise a plurality of binary optical modulators and at least one unary optical modulator.

14. The optical apparatus of claim 13 wherein the plurality of binary optical modulators are each coupled with a different bit of the multi-bit digital word and wherein each optical modulator has different physical length.

15. The optical apparatus of claim 14 wherein the physical length of each binary optical modulator doubles in length as the bit index of bit of the multi-bit digital word with which it is coupled increases by a value of one.

16. The optical apparatus of claim 15 wherein the at least one unary optical modulator comprises a series of optical modulators each of which has the same optical length and each of which controlled by thermometer code derived from the selected bits of the bits of greater bit significance of the multi-bit digital word.

17. The optical apparatus of claim 16 wherein the thermometer code is derived from a plurality of the more significant bits of the multi-bit digital word including the most bit of the multi-bit digital word.

18. A method of modulating an optical signal including arranging a plurality of optical modulators in a cascaded series thereof, addressing each of the optical modulators in the cascaded series with a single bit of a multi-bit digital word according to a state of a CMOS driver having, in use, a negligible static current flow, the CMOS driver coupling each optical modulator in the cascaded series with the single bit in the multi-bit digital word and increasing the effective optical length each of the optical modulators in the cascaded series of optical modulators by doubling the effective optical length as a bit index of the bit of the multi-bit digital word to which it is addressed increases by a bit index value equal to one.

19. A system comprising a CMOS direct driver of high impedance optical elements of an optical modulator formed by a cascaded arrangement of the optical elements, the CMOS direct driver providing, in use, approximately zero static current flow.

20. The system of claim 19 wherein the high impedance optical elements are individually weighted by changing their effective optical path lengths by changing their physical length or an optical index of refraction thereof.

21. The system of claim 19 wherein an optical intensity of the optical modulator is modified using electro-absorption or by weighting optical gain.

22. A method of reducing noise of a modulator comprising a cascaded series of individual modulators of varying effective optical lengths, the method comprising driving each of the individual modulators by a CMOS driver according to a different bit of a multi-bit digital word, the CMOS driver providing, in use, approximately a zero static current flow to said individual modulators.

23. The method of claim 22 wherein the effective optical lengths of the individual modulators are varied by varying the physical lengths of the individual modulators.

24. The method of claim 23 wherein the modulator further comprises second cascaded series of unary modulators, the unary modulators being driven by additional CMOS drivers according to a thermometer code based on bits of said multi-bit digital word having greater significance than bits used to drive said individual modulators.

25. A method of reducing noise of a modulator, the method comprising: driving the modulator by a CMOS driver and operating the CMOS driver without a terminating resistor whereby the CMOS driver provides, in use, approximately a zero static current flow to said modulator.

\* \* \* \* \*